Aug. 29, 1967 P. WILL 3,339,152

MAGNETICALLY TUNED FERRITE CAVITY TRANSISTOR OSCILLATOR

Filed Oct. 24, 1965 2 Sheets-Sheet 1

INVENTOR
PETER WILL
BY
Robertson Smythe Bryan & Parmelee
ATTORNEYS

INVENTOR
PETER WILL
BY
Robertson Smythe Bryan & Parmelee
ATTORNEYS

United States Patent Office 3,339,152

Patented Aug. 29, 1967

3,339,152

MAGNETICALLY TUNED FERRITE CAVITY TRANSISTOR OSCILLATOR

Peter Will, Seymour, Conn., assignor to Gold Line Company, Norwalk, Conn., a corporation of Connecticut Filed Oct. 24, 1965, Ser. No. 504,897

6 Claims. (Cl. 331—96)

ABSTRACT OF THE DISCLOSURE

A tuneable microwave oscillator wherein the frequency of a microwave oscillation circuit employing a transistor having main current electrodes and a common electrode is controlled or varied by the strength of an external magnetic field applied to one or more quarter-wave cavity resonators connected to the circuit and substantially completely filled with ferrite.

This invention relates to an electronically tuneable microwave oscillator and especially to a transistor and oscillator feedback circuit arrangement capable of a wide tuning range.

Prior devices have used electronic tbues, but these have not been completely satisfactory because the life expectancy of the elements is not certain, and this affects reliability. Also, the power requirements necessitating large power supplies have been higher than desirable. Mechanical means of tuning microwave circuits also have been used and these have not been satisfactory.

One of the objects of the invention is to provide an apparatus wherein the frequency of oscillation of a solid state microwave oscillator can be changed through at least one continuous octave of frequencies or one where the highest frequency of oscillation is distinctly greater in magnitude than that of the lowest, for example, a range of frequencies beginning noticeably lower than 500 mc./s. and ending noticeably higher than 1000 mc./s.

Another object of this invention is that by the application of a time varying voltage, the frequency of oscillation can be changed rapidly, i.e., the octave range can be covered in 0.01 second, approximately one hundred times per second. Such is in contrast to slow mechanical or electromechanical means.

A still further object of this invention is to increase the efficiency of an electronically tuneable microwave oscillator.

Another object of this invention is to increase the reliability.

Another object of this invention is to provide an oscillator that will have significantly lower voltage requirements as compared to microwave oscillators employing electronic tubes.

In one aspect of the invention, the oscillator circuit employs a solid state device or transistor having a base which preferably is common to RF ground. The circuit can be referred to as a base separation type transistor oscillator, the transistor including an emitter, base, and collector. Resonant emitter and collector circuits are used, such including coaxial microwave cavities filled with ferrite as explained later. The feedback circuit consists of the stray capacitances between the emitter and collector resonant circuits. For oscillations to take place, the collector base resonant circuit may be tuned to resonance at a frequency slightly lower than the desired frequency of oscillation, and the emitter base resonant circuit may be tuned to resonance at a frequency slightly higher than the desired frequency of oscillation.

As mentioned, quarter-wave length coaxial microwave cavities are connected in the emitter and collector resonant circuits, each cavity being filled with ferrite, e.g. $BaFe_{12}O_{19}$. Other ferrites can be used. The cavities have means to subject the same to magnetic induction fields supplied by electromagnets or permanent magnets. This field can be adjusted to that desired or may be a time-varying field. Preferably, the cores of the magnets have a high permeability.

These and other objects, advantages, and features of the invention will become apparent from the following description and drawings.

Figure 1:
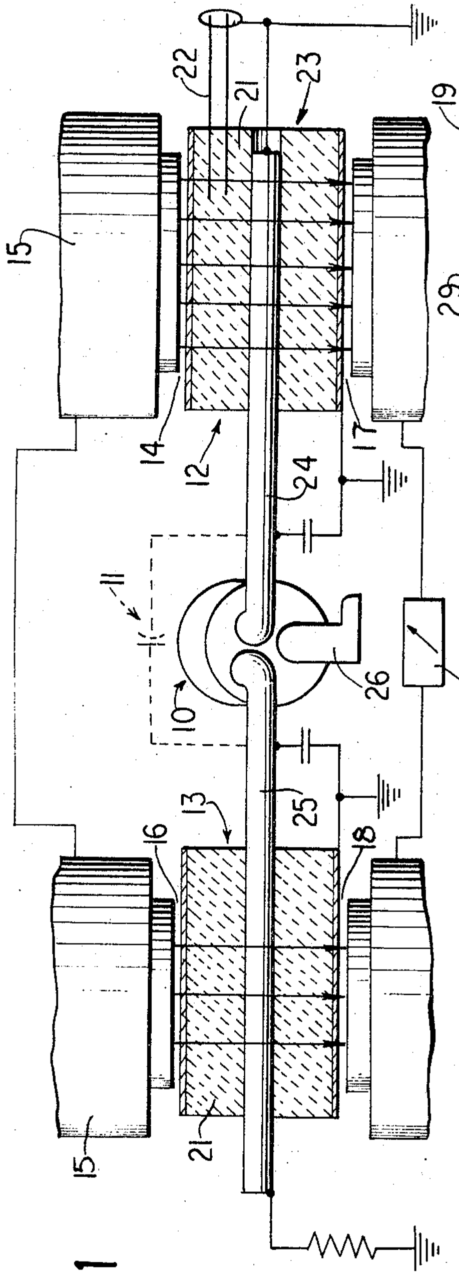
FIG. 1 is a schematic view of parts of the elements of the invention.

Referring to FIG. 1, transistor 10 has a feedback circuit 11, comprising the stray capacitances existent in the transistor or solid state device. The coaxial, quarter-wave length cavities 12, 13 are filled with ferrite. It is also possible to use wave length cavities of $n/4$ wave length where "$n$" is an odd integer. The magnetic induction field supplied is by magnetic means such as electromagnets 15 through gap spaces 14, 16, 17, 18. The magnitude of the voltage driving or fed to the electromagnets by a voltage source 19 may be varied as desired. It will vary in direct proportion to the magnitude of the magnetic induction field in the gap of the electromagnets 15. The control for source 19 may be constructed so as to provide a slowly time-varying magnetic induction field in the gap of the electromagnets. This can be referred to as the external D.C. magnetic induction field or simply as the D.C. field. The phrase "slowly time-varying" means that all possible waveforms, whose essential frequency content requires components up to 10 kc./s., have a fundamental period of 0.01 sec. or greater, i.e. 0.01 sec. or greater by a factor of a million greater than 10 sec. The D.C. magnetic induction field so described permeates the ferrite material 21 in the quarter-wave cavities 12, 13. All other conducting or non-conducting parts of the quarter-wave cavities are diamagnetic and have a relative permeability very close to that of air. Thus, for example, a high conductivity material, such as copper, burnished brass or the like, can contain or guide microwave power while remaining opaque to the impressed D.C. field, which affects only the relative permeability of the ferrite presented to the small signal microwave fields in the cavity. At lower frequencies and distinctly narrower frequency band widths, this effect has been referred to as "$\mu$" tuning.

Ferrite filled microwave quarter-wave length cavities 12, 13 are electrically shorted lengths of coaxial microwave transmission lines, whose operational electrical length, $\theta$, is equal to $\pi/2$, i.e., one-fourth of the wave length in the ferrite corresponding to any one of the operational frequencies, and are always the same as the physical length in the direction of microwave propagation in the quarter-wave length cavity.

The collector 24 quarter-wave length cavity 12 contains, close to its electrically shorted end, a small power coupling device 22 in the form of a probe which introduces a very small RF perturbation. Such a coupling device is best placed near the shorted end 23 inasmuch as the magnetic flux of the microwave field is at a maximum or a near maximum in this region.

The emitter quarter-wave length cavity 13, which is physically somewhat shorter than the collector cavity, does not have a probe device. The emitter 25 and base 26 are of the usual type.

Figure 4:
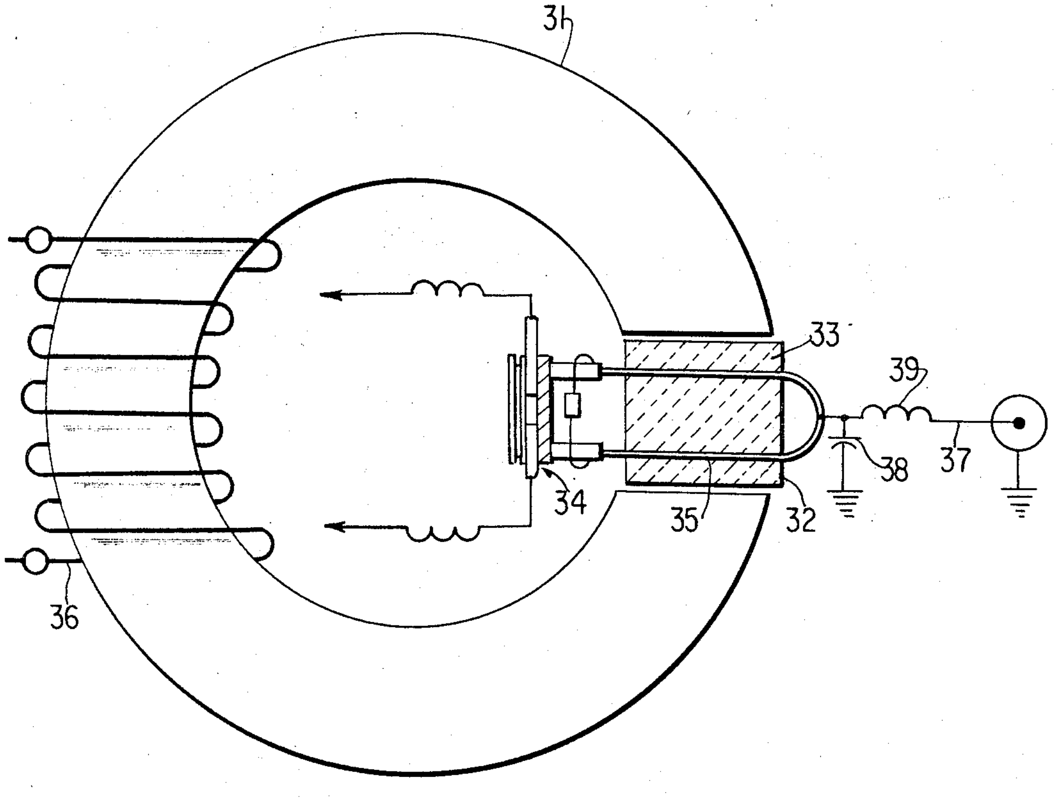
FIG. 4 shows another form of the invention.

The collector and emitter resonant circuits, employing the above described quarter-wave length cavities, can be tuned, i.e., have the resonant frequencies changed, by and in the D.C. field arising from a single voltage driven electromagnet of FIG. 4 by two individual electromagnets (FIG. 1) synchronously driven by different or identical repeating wave forms of the same fundamental period.

The electromagnets have cores of very high relative magnetic permeability and are wound with an appropriate number of turns of insulated wire. A time-varying magnitude of voltage through the wire coil varies the magnitude of the D.C. field directly, i.e., referring to FIG. 1.

$$|\overline{H}_{D.C.}|=\mu_0\frac{1}{g}NI$$

where $\mu_0$ is the absolute magnetic permeability of free space (air).

$g$ is the gap width.

N is the total number of turns coiled about the high $\mu$ core.

I is the current through the coil.

The terminal for the two ends of the wire coil about the electromagnet core are available and the user of the device may vary the magnitude of the voltage across these terminals. Control circuit 19 may be a D.C. source and potentiometer or other wave-form generating device, such as a transistor circuit for this purpose.

As indicated above, by varying said voltage, the resonant frequencies of the emitter and collector resonant circuits and ultimately the frequency of oscillation can be changed. This can be best summed up by the following mathematical expressions:

$$\omega_{osc}=f(\omega_{collector\ resonance}, \omega_{emitter\ resonance}, \epsilon_1, \epsilon_2)$$

where $$\omega_{collector\ resonance}=\left(\frac{\mu\left(\mu_0\frac{1}{g}NI\right)lZ_0C}{c}\right)^{1/2}$$

$$\omega_{emitter\ resonance}=\left(\frac{\mu\left(\mu_0\frac{1}{g}NI\right)lZ_0C}{c}\right)^{1/2}$$

and where $\epsilon_1$ is the difference between the magnitudes of $$\omega_{osc} \text{ and } \omega_{collector\ resonance}$$

$\epsilon_2$ is the difference between the magnitude of $$\omega_{osc} \text{ and } \omega_{emitter\ resonance}$$

The parameters of the above equations are fixed in the device save that of the current I. Finally, $\omega_{osc}$ is seen to be a function of the magnitude of the current, I.

The D.C. field and the microwave fields interact by means of the ferrite medium. The effect of the D.C. field on microwave fields is far stronger than the effect of the microwave fields on the D.C. field. If the microwave fields were strong enough, such an effect would be possible.

By way of possible explanation, under the influence of a uniform D.C. magnetic field, a three dimensional ferrite filled space allows two propagating modes of microwave power. If the uniform D.C. magnetic field is normal to the direction of propagation of the microwave power, the microwave Faraday effect occurs and splits two circularly polarized, rotating components of a given linear polarized input wave by giving them different propagation constants and different rates of polarization rotation.

When the D.C. magnetic field is parallel to the direction of microwave propagation, the microwave analogy to the optical birefringent effect occurs. Suitable theoretical and corresponding mathematical adjustments can be built up from the theory applied to the above described explanation of an infinite three dimentional ferrite filled space to very accurately describe these two phenomena as they occur in ferrite filled coaxial wave-guiding microwave transmission lines. The above-described position of the electric coupling perturbing probe is such that power is coupled from any and all TM modes whose propagation constant are obtained from either the Faraday effect or the birefringent effect.

Figure 3:
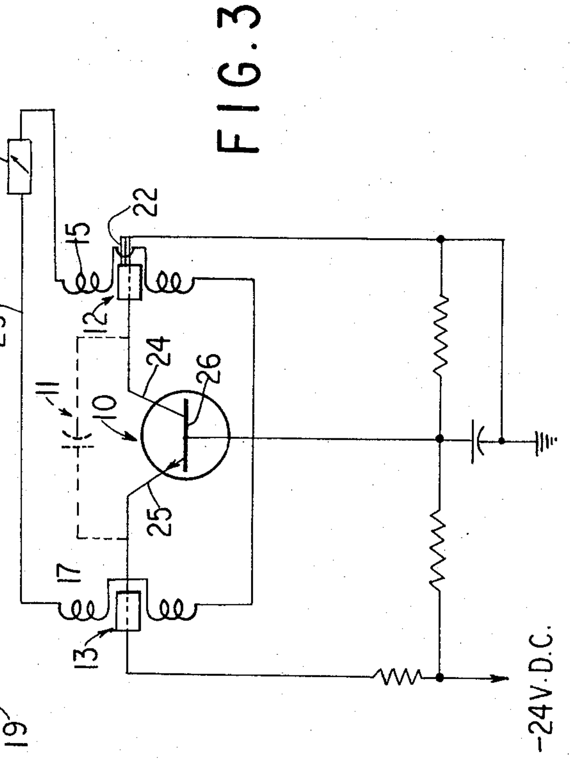
FIG. 3 is a wiring diagram.
Figure 2:
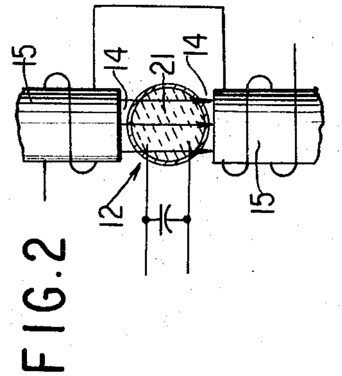
FIG. 2 is a fragmentary schematic view through one of the cavities.

In FIG. 4, a single magnet 31 has a quarter-wave microwave cavity 32 substantially completely filled with ferrite 33. Transistor 34 has its collector and emitter terminals connected to line 35 which passes through the ferrite. Winding 36 is connected to a source of control D.C. The radio frequency (RF) oscillator power is available at 37. Capacitor 38 and inductance 39 provide a matching impedance network. The transistor 34 can be connected in a manner similar to FIG. 3.

It should be apparent that details can be varied without departing from the spirit of the invention except as defined in the appended claims.

What is claimed is:

1. In a microwave oscillation circuit, the combination including a transistor having main current electrodes and a common electrode, circuit means for producing microwave oscillations connected to said electrodes, $n$ quarter-wave length cavity means where $n$ is an odd integer, ferrite within and substantially filling said cavity means, said circuit means including electrical conductor means connected to said main electrodes and extending through said ferrite axially of the cavity means, and magnetic field producing means adjacent to said cavity means for applying a magnetic induction field through said ferrite for providing a desired frequency of oscillation.

2. In a microwave oscillation circuit, the combination including a transistor having main current electrodes and a common electrode, circuit means for producing microwave oscillations connected to said electrodes, $n$ quarter-wave length cavity means where $n$ is an odd integer, ferrite within and substantially filling said cavity means, said circuit means including electrical conductor means connected to said main electrodes and extending through said ferrite axially of the cavity means, magnetic field producing means adjacent to said cavity means for applying a magnetic induction field through said ferrite for providing a desired frequency of oscillation, and D.C. control means connected to said magnetic field producing means for time-varying the induction field.

3. A circuit according to claim 1 where $n$ is 1.

4. In a microwave oscillation circuit, the combination including a transistor having collector, base and emitter electrodes, circuit means for producing microwave oscillations connected to said electrodes, said circuit means including a collector circuit and an emitter circuit each having an electrical conductor connected to its respective electrode, a quarter-wave length coaxial cavity means in the collector circuit, a quarter-wave length coaxial cavity means in the emitter circuit, ferrite within and substantially filling both said cavity means, and magnetic field producing means adjacent each of said cavity means for applying a magnetic induction field through said ferrite for providing a desired frequency of oscillation.

5. In a microwave ocsillation circuit, the combination including a transistor having collector, base and emitter electrodes, circuit means for producing microwave oscillations connected to said electrodes, said circuit means including a collector circuit and an emitter circuit each having an electrical conductor connected to its respective electrode, a quarter-wave length coaxial cavity means in the collector circuit, a quarter-wave length coaxial cavity means in the emitter circuit, ferrite within and substantially filling both said cavity means, magnetic field producing means adjacent each of said cavity means for applying a magnetic induction field through said ferrite for providing a desired frequency of oscillation, and a perturbing probe means connected to one of said conductors and extending into said ferrite adjacent one end thereof.

6. A circuit according to claim 5 wherein at least one of said cavity means is electrically shorted at one end and said probe means extends into the ferrite at said shorted end.

References Cited

UNITED STATES PATENTS

| | | | |
|---|---|---|---|
| 3,141,141 | 7/1964 | Sharpless | 331—107 |
| 3,202,945 | 8/1965 | Tachizawa et al. | 33—83 |

ROY LAKE, *Primary Examiner.*

S. H. GRIMM, *Assistant Examiner.*